(12) United States Patent
Broekaart (10) Patent No.: US 8,357,589 B2
(45) Date of Patent: Jan. 22, 2013

(54) METHOD OF THINNING A STRUCTURE

(75) Inventor: Marcel Broekaart, Theys (FR)

(73) Assignee: Soitec, Bernin (FR)

(*) Notice: Subject to any disclaimer, the term of this patent is extended or adjusted under 35 U.S.C. 154(b) by 87 days.

(21) Appl. No.: 13/129,545

(22) PCT Filed: Dec. 11, 2009

(86) PCT No.: PCT/EP2009/066889
§ 371 (c)(1),
(2), (4) Date: May 16, 2011

(87) PCT Pub. No.: WO2010/069861
PCT Pub. Date: Jun. 24, 2010

(65) Prior Publication Data
US 2011/0230034 A1   Sep. 22, 2011

(30) Foreign Application Priority Data

Dec. 15, 2008  (FR) .................................. 08 58584

(51) Int. Cl.
*H01L 21/30* (2006.01)
(52) U.S. Cl. ................................ 438/459; 257/E21.568
(58) Field of Classification Search .................. 438/456; 257/E21.123
See application file for complete search history.

(56) References Cited

U.S. PATENT DOCUMENTS

| | | | |
|---|---|---|---|
| 6,624,047 B1 | 9/2003 | Sakaguchi et al. | 438/458 |
| 6,821,376 B1 | 11/2004 | Rayssac et al. | 156/344 |
| 6,913,971 B2 | 7/2005 | Aspar et al. | 438/256 |
| 7,344,957 B2 * | 3/2008 | Barna | 438/455 |
| 7,696,015 B2 * | 4/2010 | Kim et al. | 438/122 |
| 2002/0096717 A1 | 7/2002 | Chu et al. | 257/347 |
| 2004/0198026 A1 | 10/2004 | Chu et al. | 438/479 |

FOREIGN PATENT DOCUMENTS

| | | |
|---|---|---|
| EP | 1 026 728 A2 | 8/2000 |
| EP | 1 026 738 B1 | 6/2006 |

OTHER PUBLICATIONS

Haisma et al., "Silicon-Wafer Fabrication and (Potential) Applications of Direct-Bonded Silicon," Philips Journal of Research, 49(1/2):65-89 (1995).
International Search Report, Application No. PCT/EP2009/066889, Mailed Apr. 9, 2010.
James A. Burns et al., "A Wafor-Scale 3-D Circuit Integration Technology", IEEE Transaction on Electron Devices, vol. 53, No. 10, pp. 2507-3516 (2006).

* cited by examiner

*Primary Examiner* — Chandra Chaudhari
(74) *Attorney, Agent, or Firm* — Winston & Strawn LLP (57) ABSTRACT

A method for thinning a structure of at least two assembled wafers, where one of the wafers includes channels on its surface facing the other wafer. In order to cause thinning of the structure, a fluid is introduced into the channels in a supercritical state and the fluid is passed from the supercritical state into the gaseous state. The channels do not open to the outside of the structure, such that the method further includes forming at least one access opening to the channels from the outer surface of the structure and before introducing the fluid in the supercritical state.

16 Claims, 7 Drawing Sheets

METHOD OF THINNING A STRUCTURE

This application is a 371 filing of International Patent Application PCT/EP2009/066889 filed Dec. 11, 2009.

TECHNICAL FIELD AND PRIOR ART

The present invention relates to the field of producing multilayer semiconductor wafers or substrates produced by transferring at least one layer formed from an initial substrate onto a final substrate, the transferred layer corresponding to a portion of the initial substrate. The transferred layer may further include all or part of a component or a plurality of microcomponents.

More precisely, the present invention relates to the problem of non-uniform deformations that appear during transfer of a layer from a substrate termed the "donor substrate" onto a final substrate termed the "receiving substrate". Such deformations have been observed in particular with the three-dimensional component integration technique (3-D integration) that requires one or more layers of microcomponents to be transferred onto a final support substrate, but also when transferring circuits or fabricating back-lit imagers. The transferred layer or layers include microcomponents (electronic, optoelectronic, etc) produced at least in part on an initial substrate, said layers then being stacked on a final substrate that may optionally itself include components. Primarily because of the much reduced size and large number of microcomponents present on a single layer, each transferred layer must be positioned on the final substrate with great accuracy in order to come into very strict alignment with the subjacent layer. Further, it may be necessary to carry out treatments on the layer after it has been transferred, for example to form other microcomponents, to uncover the surface of the microcomponents, to produce interconnections, etc.

However, the Applicant has observed that after transfer, there are circumstances in which it is very difficult if not impossible to form additional microcomponents that are aligned with the microcomponents that were formed before the transfer.

Figure 1A:
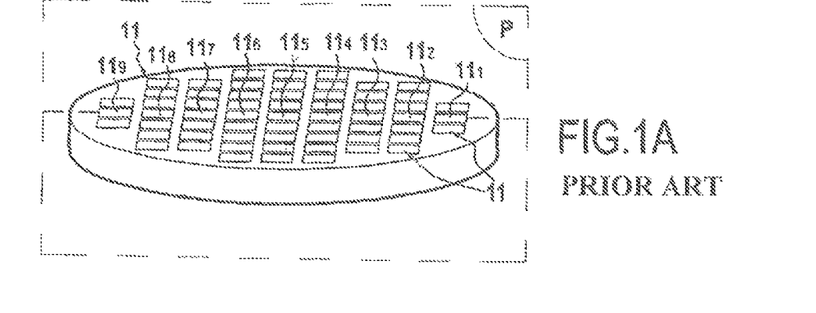
FIGS. 1A to 1E are diagrammatic views showing the production of a prior art three-dimensional structure.
Figure 1B:
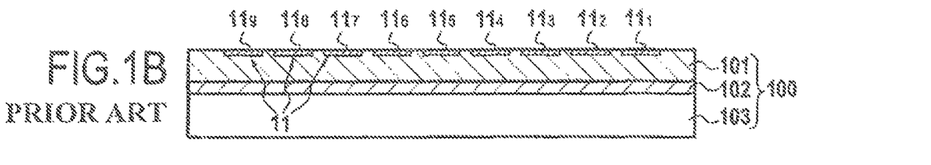

This misalignment phenomenon is described with reference to FIGS. 1A to 1E that illustrate the making of a three-dimensional structure comprising transferring a layer of microcomponents onto a final substrate, which layer of microcomponents is formed on an initial substrate, and then forming an additional layer of microcomponents on the exposed face of the initial substrate after bonding. FIGS. 1A and 1B illustrate an initial substrate 100 on which a first series of microcomponents 11 is formed. The microcomponents 11 are formed by photolithography using a mask for defining motif-formation zones corresponding to the microcomponents 11 to be produced. The initial substrate 100 here is formed by a silicon on insulator (SOI) type structure which, in known manner, comprises a support substrate 103 (for example formed from silicon), a buried oxide layer 102 (formed from $SiO_2$, for example) and an active layer 101 formed from semiconductor material on which the microcomponents 11 have been produced.

Figure 1C:
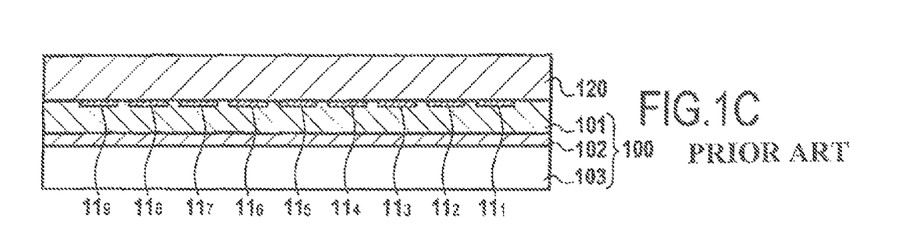
Figure 1D:
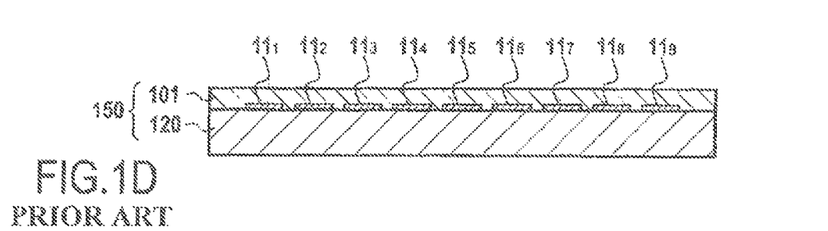

As can be seen in FIG. 1C, the face of the active layer 101 including the microcomponents 11 is then brought into intimate contact with one face of a final substrate 120. Bonding between the initial substrate 100 and the final substrate 120 is generally carried out by fusion bonding. Thus, a buried layer of microcomponents 11 is obtained at the bonding interface between substrates 100 and 120. After bonding, and as can be seen in FIG. 1D, the initial substrate 100 is thinned in order to remove the support substrate 103, the oxide layer 102 and a portion of the layer 101 present above the layer of microcomponents 11. Thinning of the initial substrate comprises a mechanical removal step that is carried out by grinding or by polishing, in particular by chemical mechanical polishing (CMP), a well known polishing technique that uses a pad associated with a polishing solution containing both an agent (for example $NH_4OH$) for chemically attacking the surface of the layer and abrasive particles (for example particles of silica) for mechanically attacking said surface. The mechanical removal step (grinding or polishing) may be followed by a removal step carried out by selective chemical etching.

Thus, a composite structure 150 is obtained, formed by the final substrate 120 and the subsisting portion of the active layer 101 after thinning.

Figure 1E:
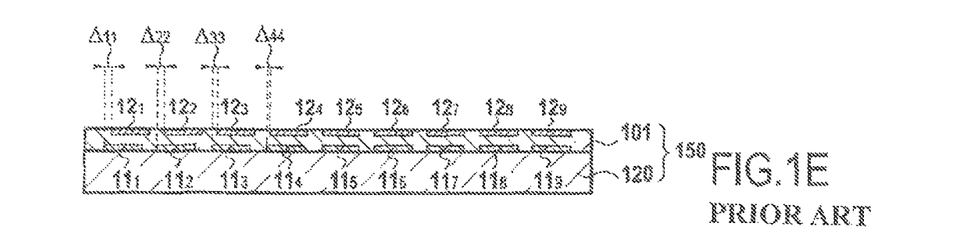

As can be seen in FIG. 1E, the next step in producing the three-dimensional structure consists in forming a second layer of microcomponents 12 at the exposed surface of the layer 101, or in carrying out complementary technical steps on that exposed surface, in alignment with the components included in the layer 101 (contact point, interconnections, etc). For the purposes of simplification, the term "microcomponents" is used in the remainder of this text to define devices resulting from technical steps carried out on or in the layers that must be positioned under accurate control. Thus, they may be active or passive components, a simple contact point or interconnections.

In order to form the microcomponents 12 in alignment with the buried microcomponents 11, a photolithography mask is used that is similar to that used to form the microcomponents 11. The transferred layers, which makes the layer 101, typically include marks both at the microcomponents and at the section forming the layer that are in particular used by the positioning and alignment tools during the technical treatment steps, such as those carried out during photolithography.

However, even using positioning tools, offsets occur between some of the microcomponents 11 and 12, such as the offsets $\Delta_n$, $\Delta_{22}$, $\Delta_{33}$, $\Delta_{44}$ indicated in FIG. 1E (respectively corresponding to the offsets observed between the pairs of microcomponents $11_1/12_1$, $11_2/12_2$, $11_3/12_3$ and $11_4/12_4$).

Such offsets result from non-uniform deformations that appear in the layer deriving from the initial substrate at least in part during the step of thinning by mechanical removal. During mechanical removal by grinding, polishing or the like, a high and non-uniform pressure is applied by the tool (for example the grinder or polishing head) on the initial substrate that is a few micrometers thick. Application of such a non-uniform pressure and the movements of the tool generate stresses (tensile and/or compressive) in the substrate, resulting in non-uniform deformations both in the plane of the layer and in other directions.

In a layer including microcomponents, such non-uniform deformations generate movements at certain microcomponents 11. In addition, certain of the microcomponents 12 formed on the exposed surface of the substrate after transfer exhibit positional variations compared with those microcomponents 11 that may be of the order of several hundred nanometers, or even one micrometer.

This phenomenon of misalignment (also termed "overlay") between the two layers of microcomponents 11 and 12 may be a source of short circuits, distortions in the stack or connection defects between the microcomponents of the two layers. This phenomenon of overlay thus results in a reduction in the quality and value of the fabricated multilayer semiconductor wafers. The impact of the phenomenon is growing because of the ceaseless increase in demand for miniaturization of microcomponents and their increased integration density per layer.

Problems with alignment during the fabrication of three-dimensional structures are well known. The document by Burns et al, "A Wafer-Scale 3-D Circuit Integration Technology", IEEE Transactions On Electron Devices, vol 53, No 10, October 2006, describes a method of detecting variations in alignment between bonded substrates. The document by Haisma et al, "Silicon-Wafer Fabrication and (Potential) Applications of Direct-Bonded Silicon", Philips Journal of Research, vol 49, No 1/2, 1995, emphasizes the importance of flatness of wafers, in particular during polishing steps, in order to obtain good quality final wafers.

More generally, it is not desirable to introduce heterogeneous deformations into a substrate during transfer thereof onto another substrate.

As a consequence, there is a need for thinning techniques which minimize the appearance of non-uniform deformations in the resulting layer.

Thus, document U.S. Pat. No. 6,821,376 discloses a method of unbonding two elements of a structure by introducing, at the bonding interface, a fluid intended to exert a force that can unbond all or part of the elements. In one particular implementation, the fluid is introduced into cavities produced on the surface of one of the two elements at the bonding interface. Unbonding between the two elements is carried out by placing the fluid in the cavities under pressure.

However, producing cavities on a bonding face of one of the elements weakens the bonding force between the elements by reducing the surface area of the bonding interface. Unfortunately, if the bonding force between the two elements is too low, certain treatments such as forming a layer of microcomponents may result in undesirable separation of the elements at this stage of the fabrication.

Furthermore, introducing a fluid and placing it under pressure must be accurately controlled to allow the pressurization to be substantially uniform throughout the volume of the cavities in order to exert a separation force between the two elements that is properly distributed. Still further, there is a risk of deformation, or even rupture, of one of the two elements.

Furthermore, placing a fluid under pressure in the cavities requires establishing a seal between the volume formed by the cavities and the volume outside the cavities. That seal is produced using seals disposed between the outer walls of the elements of the structure and the chamber in which the structure is placed. Such a seal is relatively complicated to produce and manage. In order to ensure a good seal, the seals have to be maintained against the elements with a certain bearing pressure. This bearing pressure exerts a force that opposes that applied by the pressurized fluid to allow separation of the elements.

SUMMARY OF THE INVENTION

The invention aims to overcome the above-mentioned disadvantages by proposing a solution that can minimize the appearance of non-uniform deformations in a structure during thinning thereof.

More particularly, the invention proposes a solution for unbonding two wafers of the same structure that is simple and reliable in its execution, and that also does not significantly weaken the bond between the two wafers.

To this end, the invention provides a method of thinning a structure comprising at least two wafers assembled one with the other, one of the two wafers comprising at least one channel on its surface facing the other wafer, in which method a fluid in the supercritical state is introduced into the channel or channels and the state of the fluid is modified to pass it from the supercritical state to the gaseous state. Further, the channel or channels do not open to the outside of the structure and before introducing fluid in the supercritical state, the method further comprises forming, from the outer surface of the structure, at least one opening for access to one or more channels. The access opening may be in the form of a perforation or the like and is smaller in dimension than the channel or channels. The access opening may also be obtained by exposing the channel or channels by trimming the wafer comprising said channel or channels.

Thus, by virtue of its physical properties and in particular its high diffusivity, the supercritical fluid can penetrate readily into the channel or channels present at the bonding interface. Next, by passing the fluid from the supercritical state into the gaseous state, causing a sudden increase in the volume of the fluid, a separation force is created that is exerted substantially uniformly throughout the volume of the channel or channels. This thereby avoids the appearance of non-uniform deformations that could be introduced by traditional mechanical and/or chemical thinning steps in the wafers during separation thereof.

Using a supercritical fluid that has a high diffusivity means that one or more channels with very small dimensions can be formed, which means that a small portion of the contact surface present between the two wafers is used to produce the channels. Thus, a good bond between the wafers is assured, while thinning of the structure is allowed.

Further, since the channels are encapsulated inside the structure until the access opening is formed, which is carried out at the moment when the fluid in the supercritical state is introduced, no aggressive substance such as an etching solution, and/or no contaminant can penetrate into the channel or channels. Otherwise, the quality of the wafers as well as that of the assembly (bond) could be degraded by the unwanted introduction of aggressive products and/or contaminants into the channels. Thus, by means of the method of the invention, the integrity of the structure is protected during treatments carried out before thinning thereof.

In accordance with one aspect of the invention, the fluid used is $CO_2$ in the supercritical state. The $CO_2$ may be used alone or with another fluid such as water. When used with another fluid, the fluid composed of $CO_2$ and the other fluid must be capable of being placed in the supercritical state.

The present invention also provides a method of producing a composite three-dimensional structure, comprising a step of producing a first layer of microcomponents on one face of a first substrate, a step of bonding the face of the first substrate comprising the layer of microcomponents onto a second substrate and a step of thinning the first substrate in accordance with the thinning method of the invention, the first substrate being constituted by a structure comprising at least two wafers assembled one with the other, one of the two wafers comprising at least one channel on its surface facing the other wafer.

Using the assembly method of the present invention means that during transfer of a layer of microcomponents, the phenomenon of overlay originating in the traditional chemical and/or mechanical thinning step can be eliminated or at least limited and very high quality multilayer semiconductor wafers can be produced. The layer of microcomponents may in particular include image sensors.

DETAILED DESCRIPTION OF IMPLEMENTATIONS OF THE INVENTION

The present invention is of general application to thinning a structure comprising at least two wafers assembled together, for example by molecular bonding, the thinning in accordance with the invention being carried out by introducing a supercritical fluid to the interface zone between the two wafers then by passing the fluid from the supercritical state to the gaseous state.

It is known that when a fluid is placed under pressure and temperature conditions that are above a "critical point", i.e. when its temperature and its pressure are respectively higher than a critical temperature Tc and a critical pressure Pc, the fluid is in a supercritical state and thus is termed a supercritical fluid.

By way of example, for carbon dioxide $CO_2$, this critical point corresponds to a critical temperature Tc=31.1° C. and to a critical pressure Pc=73.8 bar.

A fluid in the supercritical state has viscosity that is close to that of a gas and density close to that of a liquid, which means that it has a high diffusivity compared with a fluid in the liquid state.

More particularly, it should be noted that supercritical fluids have viscosity in the range 10 µPa·s [micropascal·second] to 30 µPa·s, like a gas, and they have density in the range 0.2 g·cm$^{-3}$ [gram per cubic centimeter] to 0.5 g·cm$^{-3}$, which is close to the density of liquids in the range 0.6 g·cm$^{-3}$ to 1.6 g·cm$^{-3}$. These viscosity and density properties mean that supercritical fluids have high diffusivity (diffusivity in the range $0.1 \times 10^{-3}$ cm$^2$·s$^{-1}$ [square centimeter per second] to $1 \times 10^{-3}$ cm$^2$·s$^{-1}$).

One mode of carrying out a thinning method is described below in relation to FIGS. 2A to 2E.

Figure 2A:
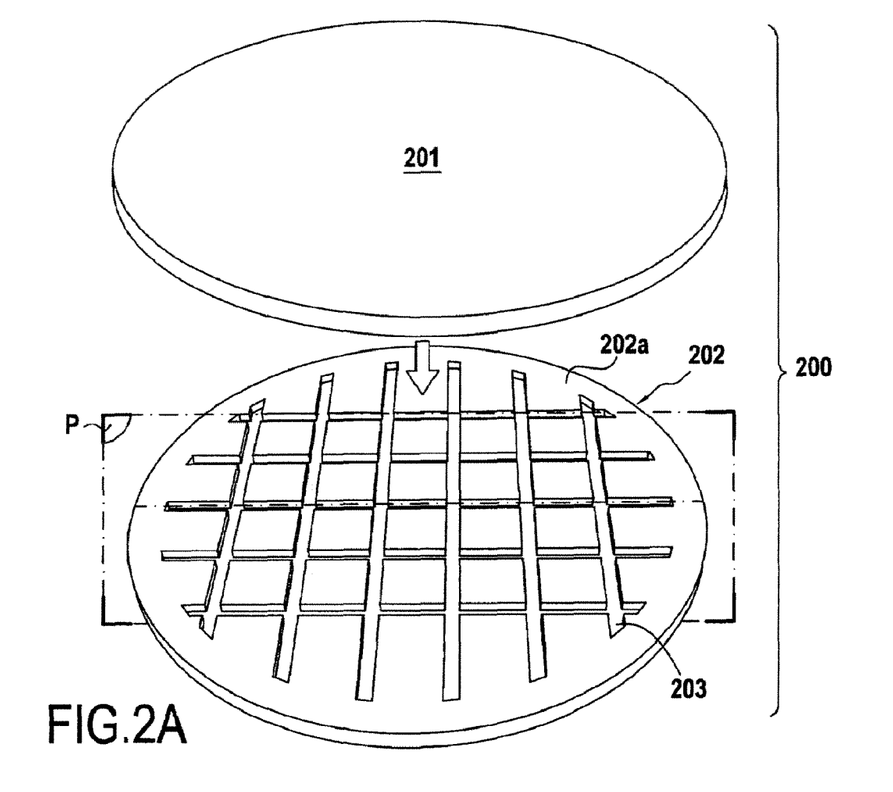
FIGS. 2A to 2E are diagrammatic views of a molecular bonding thinning method in accordance with one implementation of the invention.
Figure 2B:
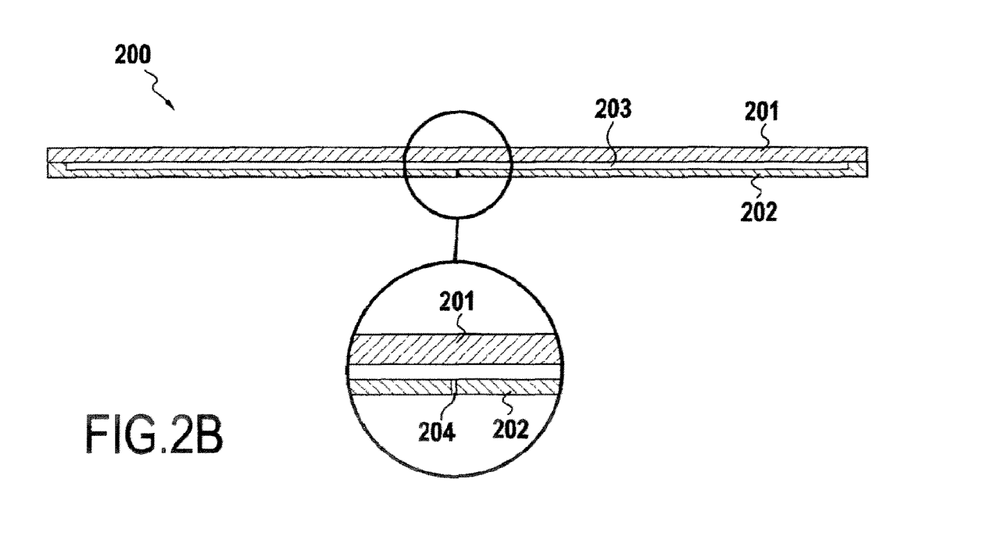

As can be seen in FIG. 2A, a structure 200 to be thinned is formed by assembling a first wafer 201 with a second wafer 202. The structure 200 may also have an additional layer (not shown) of the oxide layer type interposed between the wafers 201 and 202. In accordance with the invention, channels 203 are provided on the surface 202a of the wafer 202 intended to be brought into contact with the wafer 201 during assembly. The channels 203 may be formed by dry chemical etching, or photolithography. Once the wafers 201 and 202 have been assembled one against the other by fusion bonding or using other techniques (for example using adhesives), a structure 200 is obtained comprising a network of buried channels 203 (FIG. 2B). In the implementation shown here, the channels 203 do not open onto the outer periphery of the structure in order to protect the channels and, as a result, the structure from treatments carried out prior to thinning. An opening 204 is then made in the back side of the wafer 202 in order to form an access to the channels 203 from the outside. When the dimension of the channels, i.e. their cross section of flow, is greater than the diffusion limit for the fluid in the supercritical state, the opening 204 allowing access to the channels 203 preferably has a dimension that is smaller than that of the channels in order to impede the exit of the gas as it passes from the supercritical state to the gaseous state and thus to encourage pressurization; thus, clearly, fluid can be introduced in the supercritical state. The opening 204 may then in particular be produced by chemical etching. Access to the channels may also be obtained by peripheral trimming of the wafer comprising the channels, as described below relative to FIG. 7.

Figure 2C:
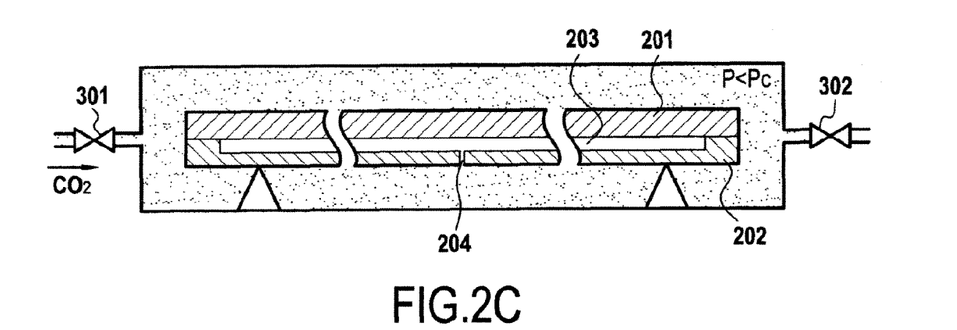

In FIG. 2C, the structure is placed in a hermetically sealed chamber 300 into which carbon dioxide $CO_2$ is introduced in the gaseous state via a supply line 301.

Figure 2D:
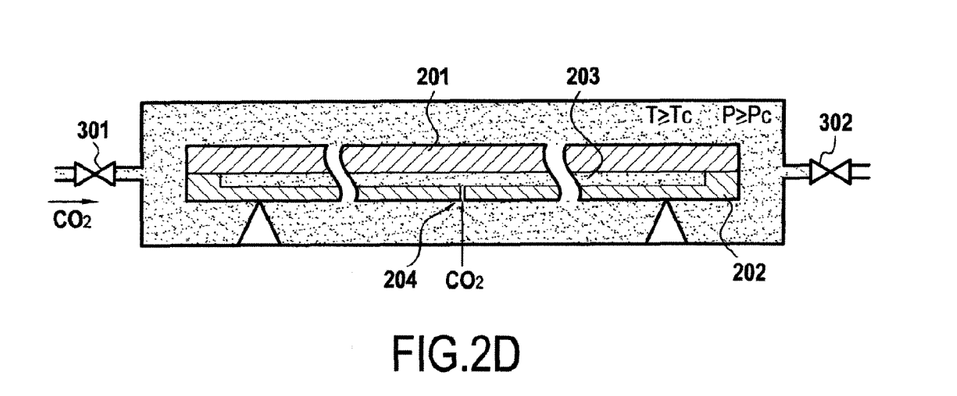

In FIG. 2D, the pressure and temperature conditions in the chamber are varied in order to heat the $CO_2$ beyond its critical temperature (31.1° C.) and to compress it above its critical pressure (73.8 bar). The temperature in the chamber 300 may be controlled by the resistance, inductive or other type heating means (not shown). The $CO_2$ may be compressed by controlling the quantity of $CO_2$ introduced into the chamber 300 via the supply line 301.

Thus, the gaseous $CO_2$ can pass from the gaseous state to the supercritical state. As indicated above, in this supercritical state, $CO_2$ in particular has a high diffusivity, which means that it can be introduced into the buried channels 203 of the structure 200 via the opening 204 forming an access to channels via the back side of the wafer 202. Thus, as mentioned above, the $CO_2$ in the supercritical state is uniformly distributed throughout the volume formed by the buried channels, which would be much more difficult or even impossible to achieve with a fluid in the gaseous state or liquid state because of their lower diffusivity. The high diffusivity of a fluid in the supercritical state means that it can penetrate well and distribution of the fluid in said channels is optimized.

Further, the $CO_2$ is introduced in the supercritical state and moves easily in channels that have very small dimensions, such as channels with a section in the range 100 nm [nanometer] to 250 nm (side or diameter), for example. Penetration of $CO_2$ in the liquid or gaseous state into such channel sections is much more difficult, if not impossible. Channels with larger sections, in particular of the order of 1 micrometer, could clearly also be used with $CO_2$ in the supercritical state.

Figure 2E:
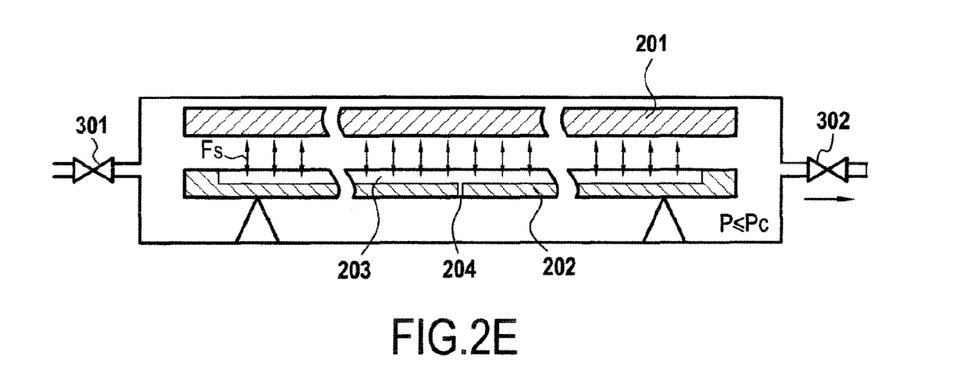

Next, as illustrated in FIG. 2E, the pressure P is varied again so that the $CO_2$ in the supercritical state can pass into the gaseous state. This variation consists of reducing the pressure in the chamber 300 in order to obtain a pressure P that is below the critical pressure Pc, for example by opening an evacuation line 302. The fluid will thus suddenly pass from the supercritical state into the gaseous state, which results in an increase in the volume of $CO_2$ present in the channels. At this moment, the $CO_2$ tries to escape from the channels. However, $CO_2$ in the gaseous state cannot move easily in the channels 203 because of the lower diffusivity of $CO_2$ in the gaseous state. Further, the only path open to the outside is constituted by the opening 204, which impedes the escape of the $CO_2$ that is then temporarily "trapped" in the channels 203. This change in the state of the $CO_2$ will thus provoke an overpressure in the channels 203 and therefore create a separation force, Fs, between the two wafers. Because of the substantially uniform distribution of the channels 203 over the whole of the bonding interface between the two wafers and the creation of a substantially identical separation force in the channels, the two wafers are thus disconnected in a balanced manner (FIG. 3C).

Thus, the thinning method of the invention, while being simple and reliable to carry out, can reduce the number of non-uniform deformations at the surface of the wafers compared with thinning carried out by grinding, polishing or any other equivalent mechanical removal.

Figure 3:
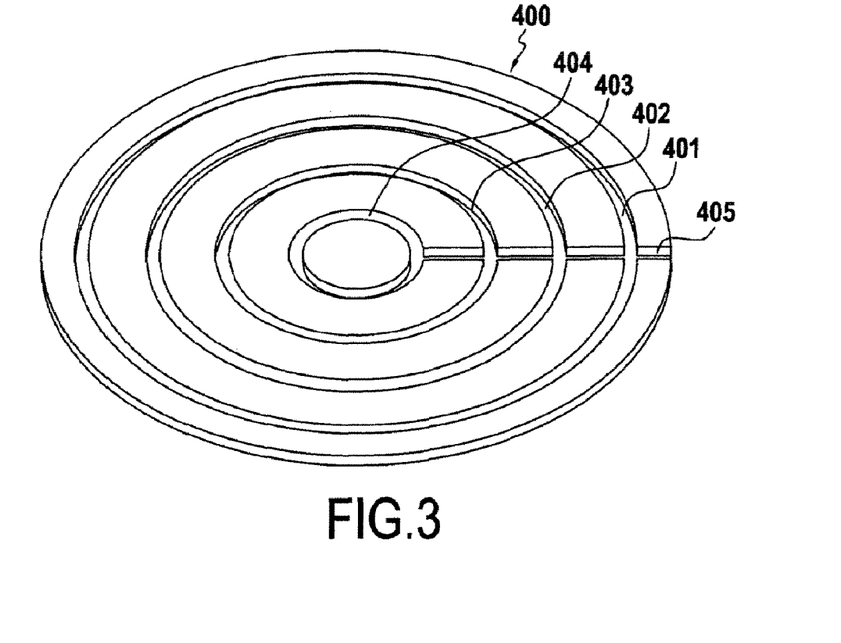
FIGS. 3 and 4 are diagrammatic illustrations of different variations in the shapes of the channels on the surface of a wafer.
Figure 4:
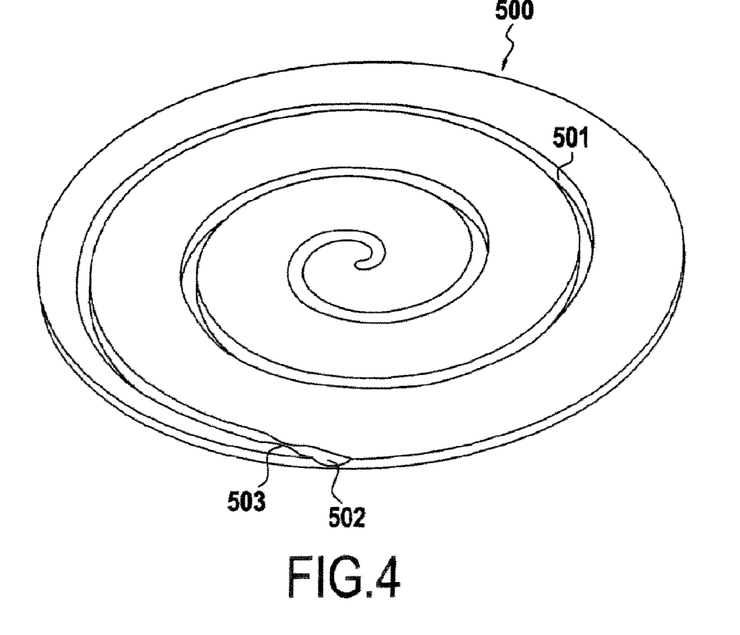

FIGS. 3 and 4 show other shapes for the channels that may be provided on the bonding face of one of the two wafers of the structure in order to allow it to be disconnected by introducing a fluid in the supercritical state and by changing the state of the fluid as described above.

FIG. 3 shows a wafer 400 on which four channels 401 to 404 have been produced, forming concentric circles centered on the wafer. A distribution channel 405 opening onto the periphery of the wafer 400 has also been produced in order to allow access to the channels 401 to 404 from for the introduction of a supercritical fluid. The number of concentric channels as well as the distribution channel may clearly be varied.

FIG. 4 has a wafer 500 on which a single channel 501 is produced. The channel 501 has the shape of a spiral that extends from the center of the wafer to its edge where it forms an access opening 502 via which a supercritical fluid may be introduced. In order to impede the escape of fluid as it passes into the gaseous state, and thus to encourage over-pressurization of the channel 501, a restriction 503 may be formed close to the opening 502 (when the dimensions of the channel (cross section of flow) is greater than the diffusion limit of the fluid in the supercritical state).

The present invention is not limited to the implementations of the channels shown in FIGS. 2A, 3 and 4 and encompasses any other variation that allows a substantially uniform distribution of the channels over the surface of a wafer.

Figure 7:
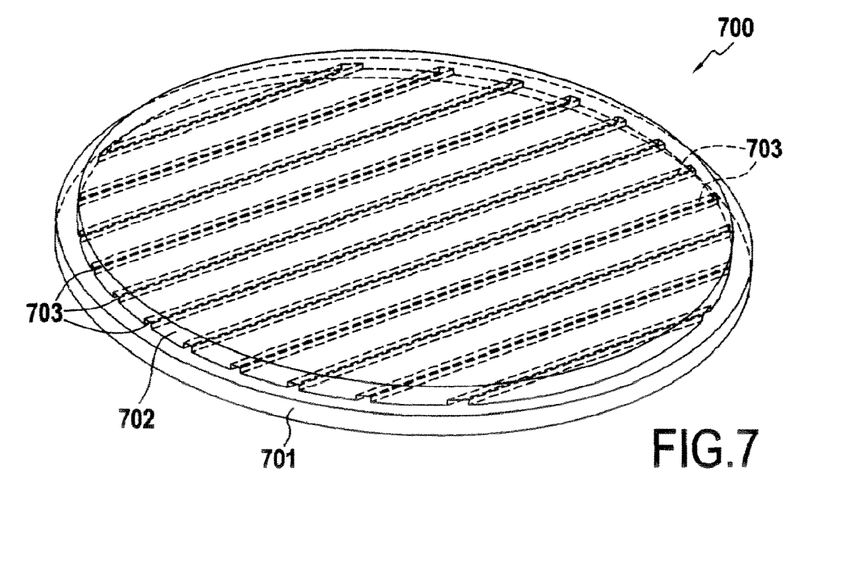
FIG. 7 is a diagrammatic illustration of a partially trimmed structure in accordance with an implementation of the invention.

Further, when the channel or channels do not open at the outer periphery of the structure, access to the channels from the outside may be achieved by a trimming operation, thus forming openings for access to the channels. FIG. 7 shows a structure 700 formed by assembling a first wafer 701 with a second wafer 702 comprising channels 703 that originally do not open at the periphery of the structure. As can be seen in FIG. 7, the structure 700 undergoes peripheral trimming at the second wafer 702, allowing the channels 703 to open to the outside of the structure. Trimming may be carried out by grinding, polishing, dry etching or wet etching. In a variation, trimming can be carried out before assembly on one of the two faces of the wafers that are brought into contact.

The method of the invention is applicable to many materials, in particular semiconductor materials such as silicon, germanium, glass, quartz, etc.

A particular but not exclusive field for the thinning method of the present invention is that of producing three-dimensional structures.

A method of producing a three-dimensional structure by transfer, onto a final substrate, of a layer of microcomponents formed on an initial substrate in accordance with an implementation of the invention is described below in relation to FIGS. 5A to 5E and 6.

Figure 5A:
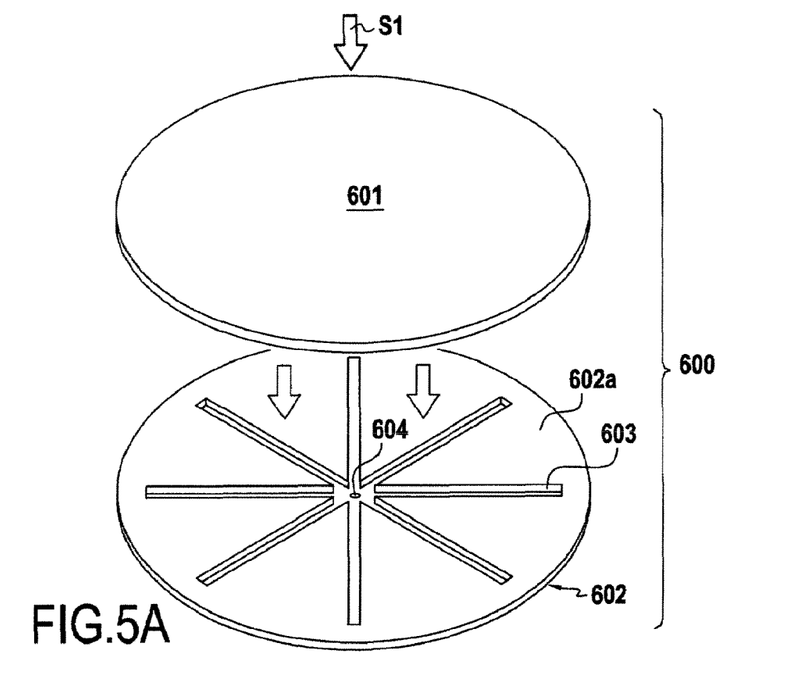
FIGS. 5A to 5E are diagrammatic views showing the production of a three-dimensional structure employing the thinning method of the present invention.

Production of a three-dimensional structure commences by producing an initial structure or substrate 600 by bonding a first wafer 601 onto a second wafer 602, for example formed from silicon (FIG. 5A, step S1). Bonding may be carried out by fusion bonding or using an adhesive. The initial structure or substrate 600 may, for example, be a SOI type structure optionally with a layer of oxide between the two wafers (not shown). In accordance with the invention, the surface 602a of the wafer 602 intended to be brought into contact with the wafer 601 comprises channels 603 that intersect close to the center of the wafer 602 and that do not open to the outside of the structure. An opening 604 for access to the channels 603, for example a perforation, is produced close to the center of the wafer 602.

Figure 5B:
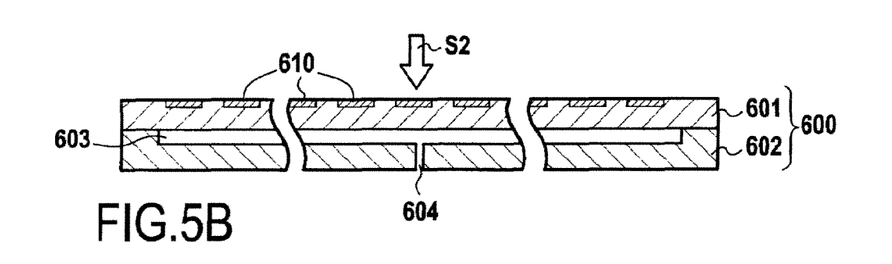
Figure 5C:
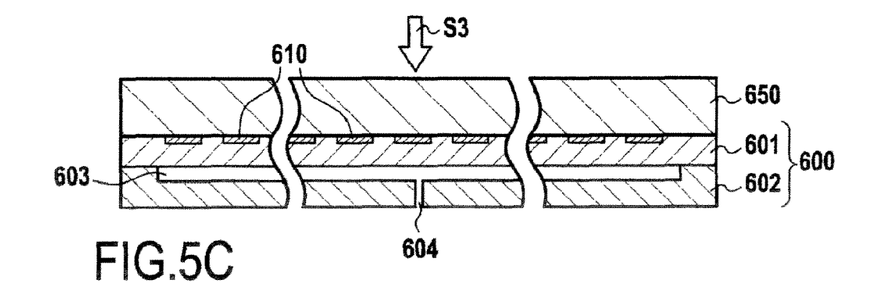

Once the initial substrate 600 has been produced, a first series of microcomponents 610 is formed on the surface of the initial structure or substrate 600 (FIG. 5B, step S2). The microcomponents 610 are formed by photolithography using a mask that can define the motif formation zones corresponding to the microcomponents 610 to be produced. During formation of the microcomponents 610 by photolithography, the initial substrate 600 is held on a chuck (not shown) comprising a support platen that is flush against the initial substrate, for example by means of an electrostatic or suction system associated with the support platen.

The face of the initial substrate 600 comprising the microcomponents 610 is then bonded with one face of a final substrate or wafer 650 (step S3, FIG. 5C) with a view to direct wafer bonding. A layer of oxide, for example formed from $SiO_2$, may also be formed on the face of the initial substrate 600 comprising the microcomponents 610 and/or on the face of the final substrate 650 intended to be brought into intimate contact.

Figure 5D:
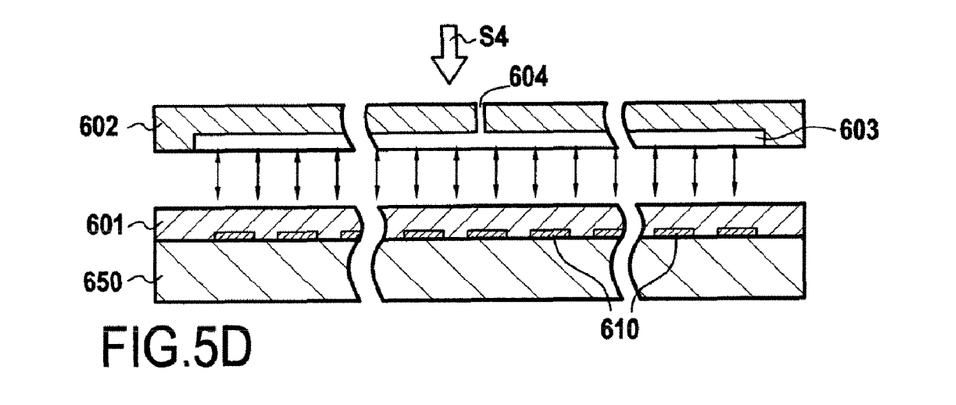

Next, the initial substrate 600 is thinned by carrying out the operations described above in relation to FIGS. 2C and 2E, namely placing the initial substrate 200 in a chamber into which $CO_2$ is introduced, placing the $CO_2$ in a supercritical state so that it can penetrate into the channels 603 via the opening 604, and causing the $CO_2$ to pass from the supercritical state to the gaseous state so as to cause separation of the wafers 601 and 602 (step S4, FIG. 5D). Next, a surface treatment of the exposed face of the wafer 601 is carried out in order to eliminate the motifs or reliefs present (channel residues).

It should be noted that the opening 604 may be produced after steps S1 to S4 if the treatments carried out during one or more of these steps could deleteriously affect the quality of the structure and/or the bond by unwanted penetration into the channels 603 of products used during said treatments.

Figure 5E:
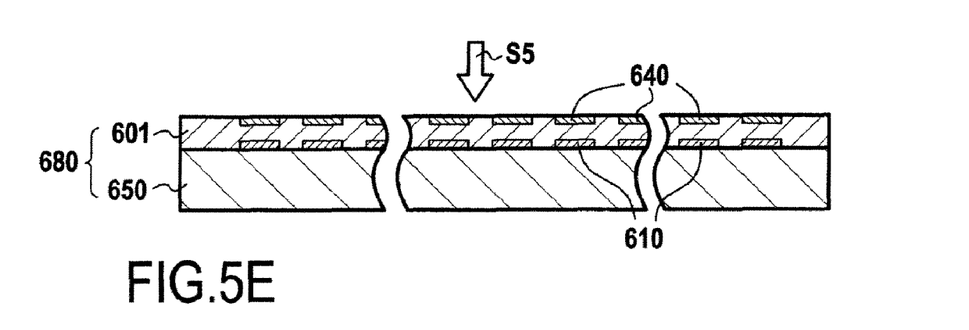
Figure 6:
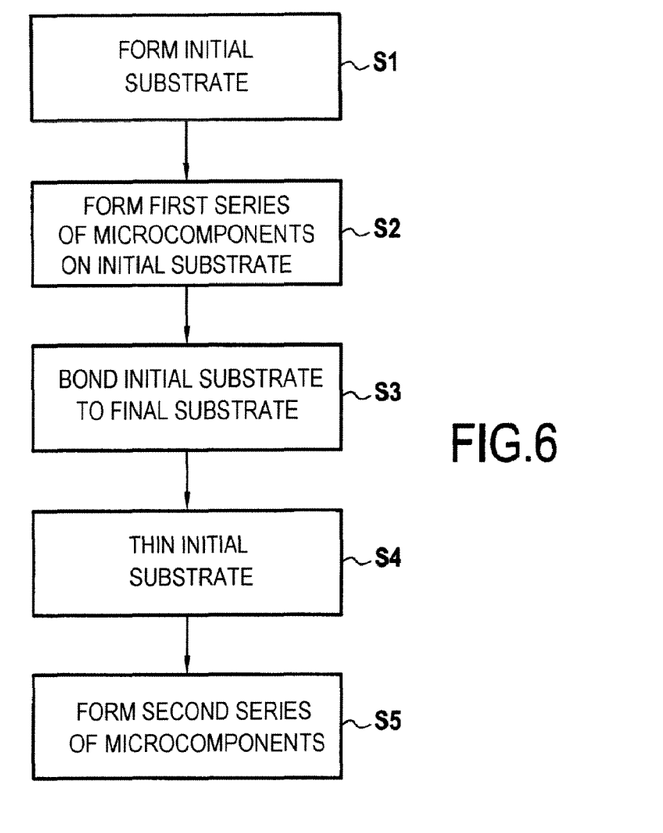
FIG. 6 is a flowchart of the steps carried out during production of the three-dimensional structure illustrated in FIGS. 5A to 5E.

As can be seen in FIG. 5E, the next step in producing a three-dimensional structure consists of forming a second layer of microcomponents 640 at the exposed surface of the wafer 601 (FIG. 5E, step S5). In order to form the microcomponents 640 in alignment with the buried microcomponents 610, a photolithography mask is used that is similar to that used to form the microcomponents 610. Similarly, during formation of the microcomponents 610, the composite structure 680 formed from the final substrate 650 and the wafer 601 is held flush against a support platen of a chuck (not shown). The photolithography mask is then applied to the free surface of the wafer 601.

In a variation, the three-dimensional structure is formed by a wafer stack, each wafer deriving from a structure that has been thinned using the method of the present invention, and each wafer being in alignment with the directly adjacent wafers.

Because of the thinning method of the invention, the initial substrate 600 can be thinned without deformation deriving from the thinning, or at least with a reduction in deformations so that significant offsets of the microcomponents 610 following thinning are no longer observed. Thus, said residual offsets following thinning can be limited to values of less than 200 nm, or even 100 nm, in a homogeneous manner over the entire wafer surface. The microcomponents 640, even those with very reduced sizes (for example <1 μm [micrometer]), may then readily be formed in alignment with the microcomponents 610, even after transfer of the initial substrate.

As a result, the assembly method of the present invention can eliminate the phenomenon of overlay during thinning of a circuit layer and can produce very high quality multilayer semiconductor wafers.

What is claimed is:

1. A method of thinning a structure comprising at least two wafers bonded at an interface between their surfaces wherein one of the two wafers includes at least one channel on its surface which channel does not open to outside of the structure, which method comprises forming from the outer surface of the structure, at least one opening for access to the at least one channel; introducing a fluid in the supercritical state into the at least one channel; and passing the fluid from the supercritical state into the gaseous state to generate a substantially uniform force in the at least one channel.

2. The method of claim 1, wherein the fluid is carbon dioxide.

3. The method of claim 1, wherein the access opening has dimensions that are smaller than those of the at least one channel.

4. The method of claim 1, wherein the forming of the at least one access opening comprises trimming the wafer that includes the at least one channel.

5. The method of claim 1, wherein the at least one channel is a single spiral channel.

6. The method of claim 1, wherein the at least one channel comprises a plurality of intersecting channels.

7. The method of claim 6, wherein the channels are circular or linear channels.

8. The method of claim 7, wherein the channels include a plurality of circular channels connected by a linear channel.

9. The method of claim 7, wherein the channels include a plurality of linear channels that intersect to form a pattern.

10. The method of claim 7, wherein the channels are distributed in a substantially uniform manner.

11. The method of claim 1, wherein the at least one channel has a section in the range 100 nm to 250 nm.

12. A method of producing a three-dimensional composite structure which comprises producing a first layer of microcomponents on one face of a first substrate, bonding the face of the first substrate onto a second substrate, and thinning the first substrate as set forth in claim 1.

13. The method of claim 12, which further comprises producing a second layer of microcomponents on the face of the first substrate opposite to the face comprising the first layer of microcomponents.

14. The method of claim 12, which further comprises, prior to bonding; forming a layer of oxide on the face of the first substrate that includes the first layer of microcomponents.

15. The method of claim 12, wherein the first substrate is a SOI structure.

16. The method of claim 12, wherein the at least the first layer of microcomponents includes image sensors.

* * * * *